US012614597B2

(12) United States Patent 
Shin

(10) Patent No.: US 12,614,597 B2 
(45) Date of Patent: Apr. 28, 2026

(54) SEMICONDUCTOR DEVICE AND OPERATING METHOD USING TEMPERATURE-COMPENSATED PASS PERMISSION BITS

(71) Applicant: SK hynix Inc., Gyeonggi-do (KR)

(72) Inventor: Hyun Seob Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 112 days.

(21) Appl. No.: 18/619,186

(22) Filed: Mar. 28, 2024

(65) Prior Publication Data

US 2025/0201318 A1 Jun. 19, 2025

(30) Foreign Application Priority Data

Dec. 18, 2023 (KR) ........................ 10-2023-0184075

(51) Int. Cl.
| | |
|---|---|
| *G11C 16/34* | (2006.01) |
| *G11C 16/04* | (2006.01) |
| *G11C 16/10* | (2006.01) |
| *G11C 16/24* | (2006.01) |

(52) U.S. Cl.
CPC ...... *G11C 16/3459* (2013.01); *G11C 16/0483* (2013.01); *G11C 16/10* (2013.01); *G11C 16/24* (2013.01)

(58) Field of Classification Search
CPC . G11C 16/3459; G11C 16/0483; G11C 16/10; G11C 16/24; G11C 11/5628; G11C 7/04; G11C 16/08
See application file for complete search history.

(56) References Cited

U.S. PATENT DOCUMENTS

2012/0218823 A1* 8/2012 Tanzawa ............ G11C 16/0483 
 365/185.18 
2023/0386586 A1* 11/2023 Islam ..................... G11C 16/26

FOREIGN PATENT DOCUMENTS

KR 10-2458918 B1 10/2022 
KR 10-2023-0114529 A 8/2023

* cited by examiner

*Primary Examiner* — Amir Zarabian 
*Assistant Examiner* — Bradley S Coon 
(74) *Attorney, Agent, or Firm* — IP & T GROUP LLP

(57) ABSTRACT

A semiconductor device may include memory strings coupled between bit lines, respectively, and a source line, each of memory strings including memory cells coupled to word lines, and page buffers coupled to the bit lines, respectively, each of page buffers configured to output a verification result by sensing data that have been stored in memory cells that are coupled to each selected word line, among the memory strings, after a start of a verification operation of a program operation. The number of memory cells that have been programmed successfully and a pass permission bit may be compared based on a temperature of the semiconductor device and the verification result after the start of the verification operation of the program operation, wherein the pass permission bit corresponds to the temperature.

6 Claims, 5 Drawing Sheets

| Temp.(℃) | Pass permission bits |
|---|---|
| >90 | 50 |
| 90~71 | 50-a |
| 70~51 | 50-2a |
| 50~31 | 50-3a |
| 30~11 | 50-4a |
| 10~-9 | 50-5a |
| -10~-29 | 50-6a |
| <-29 | 50-7a |

FIG. 4

| Temp.(°C) | Pass permission bits |
|-----------|----------------------|
| >90 | 50 |
| 90~71 | 50-a |
| 70~51 | 50-2a |
| 50~31 | 50-3a |
| 30~11 | 50-4a |
| 10~-9 | 50-5a |
| -10~-29 | 50-6a |
| <-29 | 50-7a |

SEMICONDUCTOR DEVICE AND OPERATING METHOD USING TEMPERATURE-COMPENSATED PASS PERMISSION BITS

CROSS-REFERENCE TO RELATED APPLICATION

This application claims priority under 35 U.S.C. § 119 to Korean Patent Application No. 10-2023-0184075 filed on Dec. 18, 2023, which is incorporated herein by reference in its entirety.

BACKGROUND

1. Technical Field

Embodiments of the present disclosure relate to an integrated circuit technology and, more particularly, to a semiconductor device and an operating method of the semiconductor device.

2. Related Art

Recently, as an electronic device has been reduced in size, has low power consumption and high performance, and is diversified, a semiconductor device capable of storing information is required for various electronic devices, such as computers and portable communication devices. The semiconductor device may be basically divided into a volatile memory device and a nonvolatile memory device. The volatile memory device has a fast data processing speed but has a disadvantage in that the volatile memory device needs to be continuously supplied with power in order to maintain data that has been stored in the volatile memory device. The nonvolatile memory device does not need to be continuously supplied with power in order to maintain data that has been stored in the nonvolatile memory device but has a disadvantage in that the nonvolatile memory device has a low data processing speed.

The nonvolatile memory device performs a program operation to store data therein and performs an erase operation to erase data stored therein. Furthermore, the nonvolatile memory device performs an operation of verifying whether data stored therein have been programmed or erased successfully after the start of the program operation or the erase operation, and performs a read operation for outputting data programmed therein.

There is a need for a technology for preventing the deterioration of a distribution of memory cells according to a temperature because the deterioration of the distribution of the memory cells may occur after the start of a program operation depending on the temperature.

SUMMARY

In an embodiment of the present disclosure, a semiconductor device may include a plurality of memory strings coupled between a plurality of bit lines, respectively, and a source line, the plurality of memory strings including a plurality of memory cells coupled to a plurality of word lines, and a plurality of page buffers coupled to the plurality of bit lines, respectively, each of the plurality of page buffers configured to output a verification result by sensing data that have been stored in memory cells that are coupled to each selected word line, among the plurality of memory strings, after a start of a verification operation of a program operation. The number of memory cells that have been programmed successfully and a pass permission bit may be compared based on a temperature of the semiconductor device and the verification result after the start of the verification operation of the program operation, wherein the pass permission bit corresponds to the temperature.

In an embodiment of the present disclosure, an operating method of a semiconductor device may include performing a program operation, providing a program pulse to a selected word line, sensing memory cells to which the program pulse has been provided through a plurality of bit lines, and comparing the number of memory cells that have been programmed successfully, among the memory cells, in the sensing of the memory cells, and comparing a pass permission bit according to a temperature of the semiconductor device.

BRIEF DESCRIPTION OF THE DRAWINGS

FIGS. 3 to 5 are diagrams for describing a program operation according to an embodiment of the present disclosure.

DETAILED DESCRIPTION

Hereinafter, embodiments according to the technical spirit of the present disclosure are described with reference to the accompanying drawings.

Embodiments of the present disclosure may provide a semiconductor device and an operating method of the semiconductor device, which can prevent the deterioration of a program distribution of memory cells according to a temperature.

It is possible to prevent the deterioration of a distribution of memory cells according to a temperature.

Figure 1:
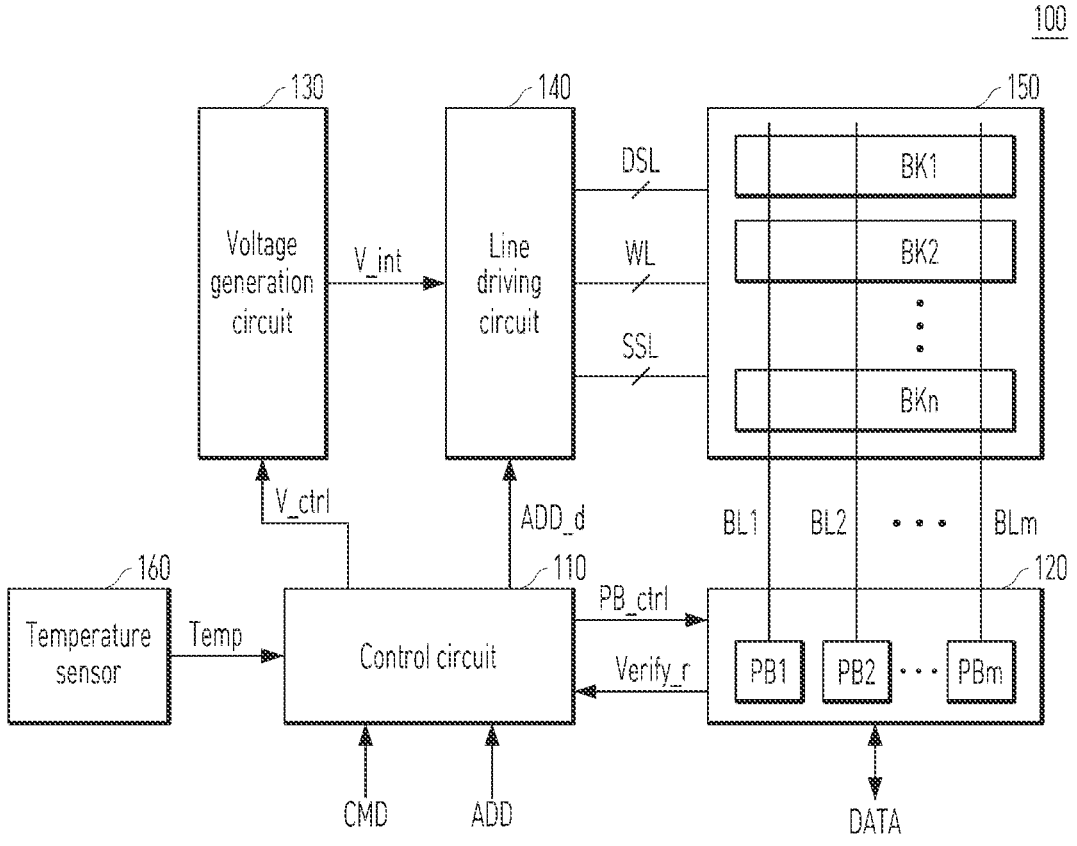
FIG. 1 is a diagram illustrating a construction of a semiconductor device according to an embodiment of the present disclosure.

FIG. 1 is a diagram illustrating a construction of a semiconductor device 100 according to an embodiment of the present disclosure.

Referring to FIG. 1, the semiconductor device 100 include a control circuit 110, a page buffer group 120, a voltage generation circuit 130, a line driving circuit 140, a memory cell array 150, and a temperature sensor 160.

The control circuit 110 may program data into the memory cell array 150 or erase data that have been programmed into the memory cell array 150 by controlling the page buffer group 120, the voltage generation circuit 130, and the line driving circuit 140. Furthermore, the control circuit 110 may sense data that have been stored in the memory cell array 150 and output the sensed data, by controlling the page buffer group 120, the voltage generation circuit 130, and the line driving circuit 140. The controlling for sensing data and outputting the sensed result is described below. Furthermore, the control circuit 110 may perform an operation of verifying whether data that have been programmed into the memory cell array 150 have been programmed successfully.

For example, the control circuit 110 may generate a page buffer control signal PB_ctrl based on a command signal CMD and an address signal ADD that are received from the outside (e.g., a host). Further, the control circuit 110 may provide the page buffer control signal PB_ctrl to the page buffer group 120.

The control circuit 110 may generate a voltage control signal V_ctrl based on the command signal CMD. Further, the control circuit 110 may provide the voltage control signal V_ctrl to the voltage generation circuit 130.

The control circuit 110 may generate a driving address signal ADD_d based on the command signal CMD and the address signal ADD. Further, the control circuit 110 may provide the driving address signal ADD_d to the line driving circuit 140.

The page buffer group 120 may include a plurality of page buffers PB1 to PBm. The plurality of page buffers PB1 to PBm may be connected to a plurality of bit lines BL1 to BLm, wherein m is a natural number, respectively. The plurality of page buffers PB1 to PBm may each sense a data value that has been stored in a memory cell through a bit line, and may output the sensed value as data DATA. Furthermore, the page buffer group 120 may provide a verification result Verify_r to the control circuit 110 after the start of a verification operation of a program operation. In this case, the plurality of page buffers PB1 to PBm may each sense a data value that have been stored in a memory cell through a bit line, and may provide to the control circuit 110 the sensed value as the verification result Verify_r. For example, the verification result Verify_r may include a plurality of verification pass bits. The number of verification pass bits may be increased when the number of memory cells having a program state that is determined to be successful is increased. The number of verification pass bits may be decreased when the number of memory cells having a program state that is determined to be successful is decreased. In an embodiment, the number of memory cells having a program state that is determined to be successful may be sensed through the plurality of bit lines BL1 to BLm.

The voltage generation circuit 130 may generate internal voltages V_int having various voltage levels based on the voltage control signal V_ctrl. Further, the voltage generation circuit 130 may provide the internal voltages V_int to the line driving circuit 140. For example, the voltage generation circuit 130 may generate the internal voltages V_int having different voltage levels, such as a program voltage, a read voltage, and a pass voltage, based on the voltage control signal V_ctrl.

The line driving circuit 140 may drive drain selection lines DSL, word lines WL, and source selection lines SSL to the voltage levels of the internal voltages V_int based on the driving address signal ADD_d. For example, the line driving circuit 140 may drive one or more of the drain selection lines DSL, the word lines WL, and the source selection lines SSL to the voltage levels of the internal voltages V_int based on the driving address signal ADD_d. More specifically, for example, the line driving circuit 140 may drive at least one of the drain selection lines DSL and at least one of the source selection lines SSL to the voltage level of a pass voltage after the start of a read operation. Furthermore, the line driving circuit 140 may drive at least one of the word lines WL to the voltage level of a read voltage and drive the remaining word lines to the voltage level of a pass voltage after the start of a read operation.

The memory cell array 150 may include a plurality of memory blocks BK1 to BKn, wherein n is a natural number. The plurality of memory blocks BK1 to BKn may be selected by the word lines WL, respectively. The memory strings of a selected memory block may be connected to the plurality of page buffers PB1 to PBm through the bit lines BL1 to BLm. Furthermore, the plurality of memory blocks BK1 to BKn may each include a plurality of memory strings in each of which a plurality of memory cells has been connected in series. The plurality of memory strings may each include a first selection transistor (e.g., a drain selection transistor), a second selection transistor (e.g., a source selection transistor), and a dummy cell in addition to a plurality of memory cells that are connected in series. The first selection transistor may be configured to be turned on or turned off by the drain selection line DSL. The second selection transistor may be configured to be turned on or turned off by the source selection line SSL.

The temperature sensor 160 may provide temperature information Temp to the control circuit 110 by detecting a temperature of the semiconductor device 100. The control circuit 110 may determine a pass permission bit based on the temperature information Temp after the start of a verification operation of a program operation.

The semiconductor device 100 described above according to an embodiment of the present disclosure may determine whether to continue a program operation based on the verification result Verify_r of the program operation and the temperature information Temp. In this case, the control circuit 110 may determine whether to continue the program operation by comparing the number of verification pass bits according to the verification result Verify_r with the number of pass permission bits according to the temperature (i.e., temperature information Temp). For example, the semiconductor device 100 according to an embodiment of the present disclosure may terminate a program operation when the number of verification pass bits (i.e., the number of memory cells on which a program has been completed successfully) based on the verification result Verify_r is greater than the number of pass permission bits according to a temperature detected after the start of the program operation.

Figure 2:
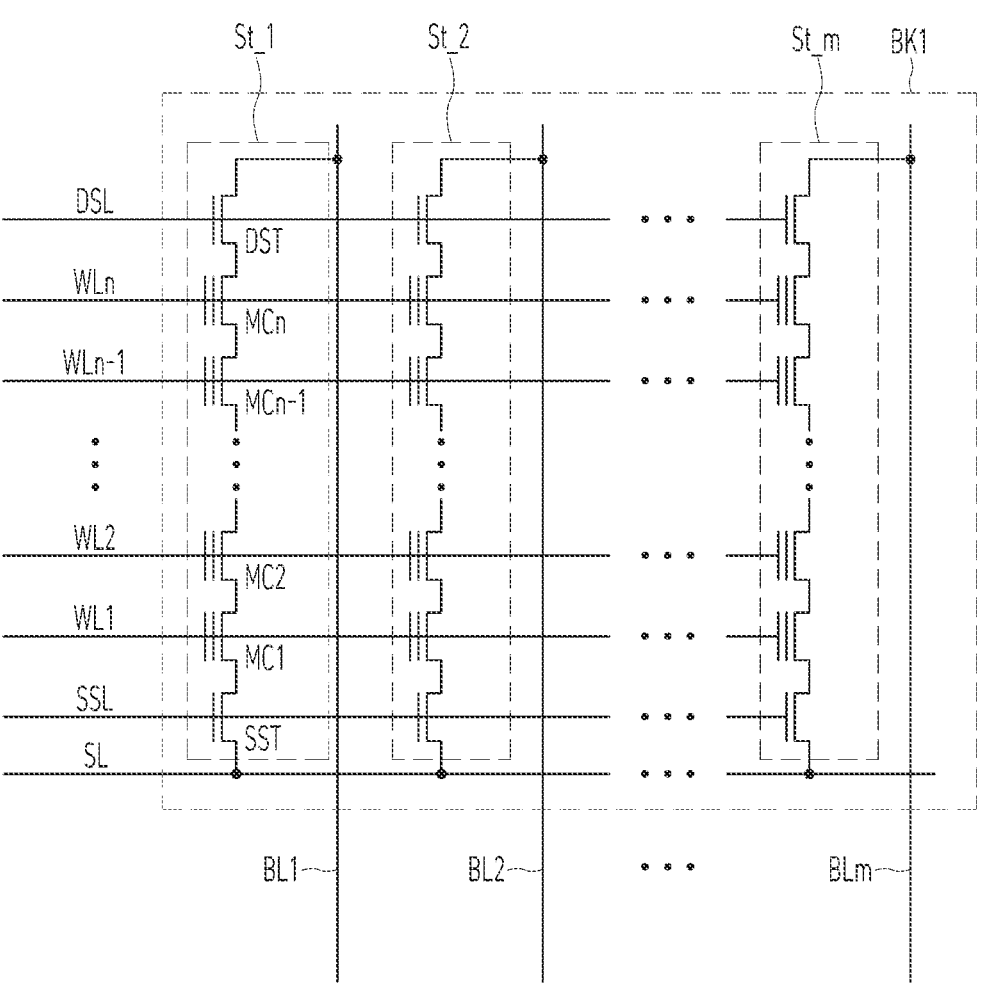
FIG. 2 is a diagram illustrating a construction of a memory block according to an embodiment of the present disclosure.

FIG. 2 is a diagram illustrating a construction of a memory block according to an embodiment of the present disclosure.

For example, FIG. 2 illustrates a memory block BK1, among the plurality of memory blocks BK1 to BKn that are included in the memory cell array 150 of FIG. 1.

Referring to FIG. 2, the memory block BK1 may include a plurality of memory strings St_1 to St_m that are connected between the plurality of bit lines BL1 to BLm, respectively, and a source line SL. The plurality of memory strings St_1 to St_m may each include at least one drain selection transistor DST, a plurality of memory cells MC1 to MCn, and at least one source selection transistor SST. For example, a first memory string St_1 may include the drain selection transistor DST, the plurality of memory cells MCn to MC1, and the source selection transistor SST that are connected in series between a first bit line BL1 and the source line SL. The drain selection transistor DST may be configured to be turned on or turned off by a drain selection line DSL. The source selection transistor SST may be configured to be turned on or turned off by a source selection line SSL. Furthermore, the plurality of memory cells MC1 to MCn may be configured to be controlled by a plurality of word lines WL1 to WLn, respectively.

Referring to FIGS. 1 and 2, the semiconductor device 100 according to an embodiment of the present disclosure may be configured so that memory cells that are connected to a selected word line, among the memory cells included in the plurality of memory strings St_1 to St_m, are programmed after the start of a program operation. In this case, a verification operation for the memory cells that have been programmed through the plurality of bit lines BL1 to Bm may be performed by the plurality of page buffers PB1 to PBm. For example, the plurality of page buffers PB1 to PBm may each sense a program state of each memory cell through a corresponding bit line, and may provide to the control circuit 110 a result of the sensing as a plurality of verification pass bits. Accordingly, the page buffer group 120 may provide the control circuit 110 with the verification result Verify_r including the plurality of verification pass bits.

Figure 3:
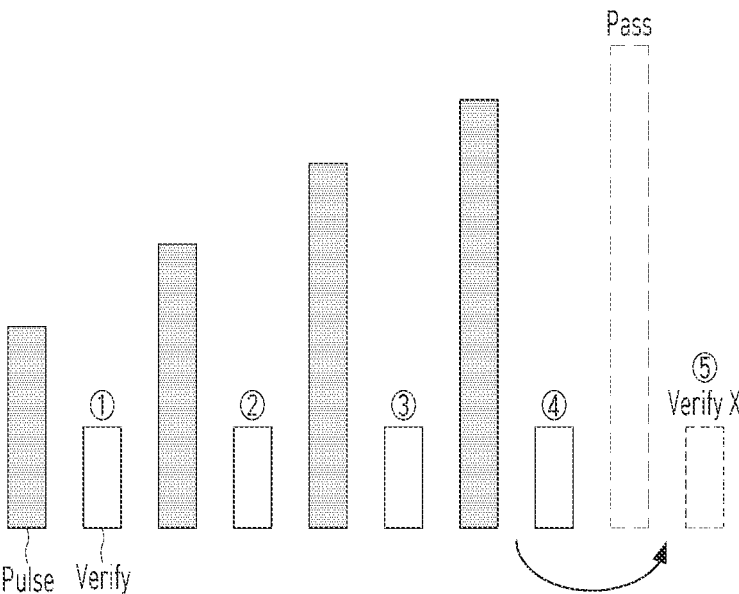
Figure 5:
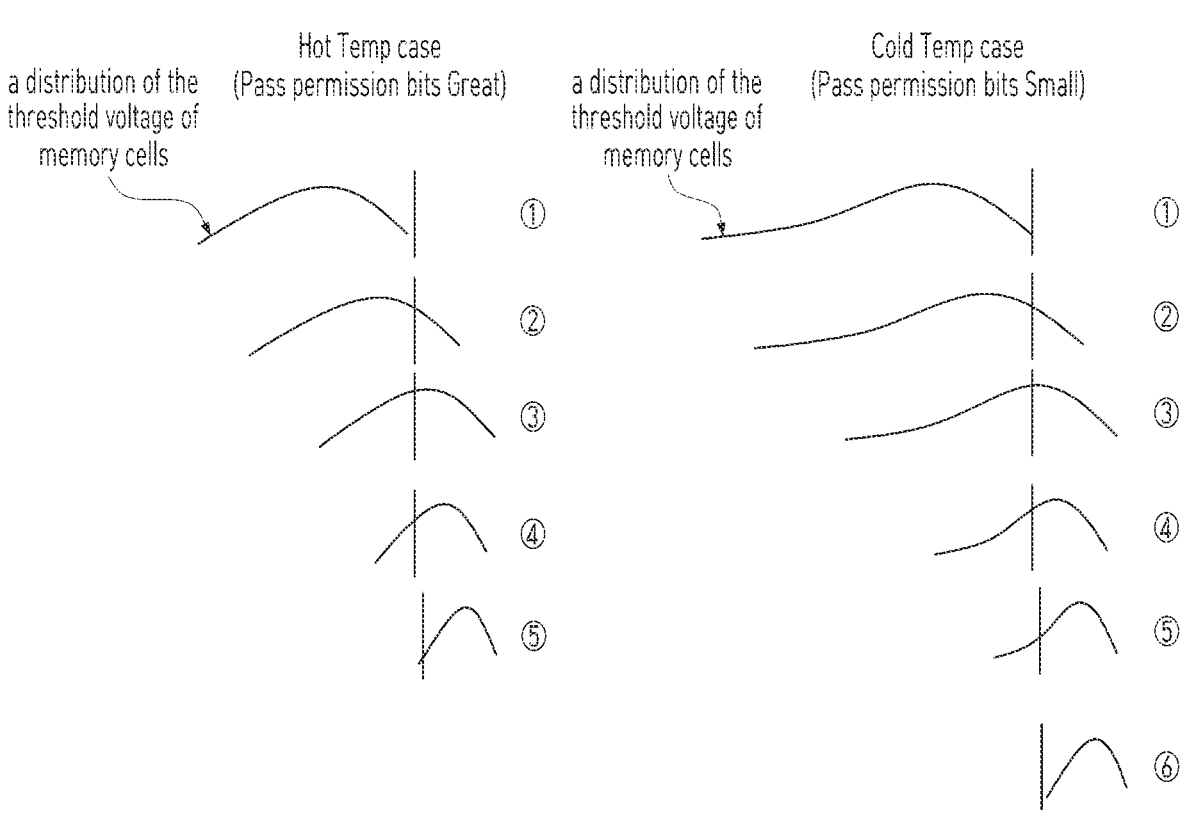

FIGS. 3 to 5 are diagrams for describing a program operation according to an embodiment of the present disclosure.

FIG. 3 is a diagram for describing a program method of the semiconductor device according to an embodiment of the present disclosure.

In a program operation of the semiconductor device 100 according to an embodiment of the present disclosure, a verification operation Verify may be performed on memory cells that are connected to a selected word line after a program pulse Pulse is provided to the selected word line. In this case, the current program pulse Pulse may be provided by raising the level of the previous program pulse until the number of memory cells that have been programmed successfully, among the memory cells to which the program pulse Pulse has been provided in the verification operation, is greater than the number of pass permission bits.

Referring to FIG. 3, for example, memory cells may be programmed by providing the first program pulse Pulse to a selected word line. The second program pulse Pulse may be provided to the memory cells because the number of memory cells that have been programmed successfully, that is, the number of verification pass bits, is not greater than the number of pass permission bits after the start of the first verification operation Verify (①). After the second program pulse Pulse is provided, the second verification operation Verify (②) may be performed. The third program pulse Pulse may be provided to the memory cells because the number of memory cells that have been programmed successfully (i.e., the number of verification pass bits) is not greater than the number of pass permission bits after the start of the second verification operation Verify (②). After the third program pulse Pulse is provided, the third verification operation Verify (③) may be performed. The fourth program pulse Pulse may be provided to the memory cells because the number of memory cells that have been programmed successfully (i.e., the number of verification pass bits) is not greater than the number of pass permission bits after the start of the third verification operation Verify (③). After the fourth program pulse Pulse is provided, the fourth verification operation Verify (④) may be performed. The fifth program pulse Pulse might not be provided to the memory cells and the fifth verification operation Verify (⑤) might not be performed either because the number of memory cells that have been programmed successfully (i.e., the number of verification pass bits) is greater than the number of pass permission bits in the fourth verification operation Verify (④). That is, the program operation may be completed. As shown in shaded bars, the level of the second program pulse Pulse may be greater than the level of the first program pulse Pulse. The level of the third program pulse Pulse may be greater than the level of the second program pulse Pulse. The level of the fourth program pulse Pulse may be greater than the level of the third program pulse Pulse. That is, the level of the program pulse may be raised as the number of program pulses provided is increased.

FIG. 4 illustrates pass permission bits according to temperatures in the semiconductor device according to an embodiment of the present disclosure.

In some embodiments, the pass permission bits according to temperatures in the semiconductor device may be reduced as temperatures are lowered. Furthermore, the pass permission bits according to temperatures in the semiconductor device may be increased as temperatures rise.

In FIG. 4, when the temperature Temp is greater than 90°, the number of pass permission bits may be 50. When the temperature Temp is between 71° and 90°, the number of pass permission bits may be '50-a.' When the temperature Temp is between 51° and 70°, the number of pass permission bits may be '50-2a.' When the temperature Temp is between 31° and 50°, the number of pass permission bits may be '50-3a.' When the temperature Temp is between 11° and 30°, the number of pass permission bits may be '50-4a.' When the temperature Temp is between −9° and 10°, the number of pass permission bits may be '50-5a.' When the temperature Temp is between −29° and −10°, the number of pass permission bits may be '50-6a.' When the temperature Temp is −29° or less, the number of pass permission bits may be '50-7a'. For example, 'a' may be natural numbers up to 7.

A program operation of the semiconductor device according to an embodiment of the present disclosure may be described as follows by taking FIG. 5 as an example. In this case, whenever the program pulse Pulse is provided to one or more memory cells, the threshold voltage of the memory cell may be raised. FIG. 5 illustrates that a distribution of the threshold voltages of memory cells is shifted to the right whenever the program pulse Pulse is provided to the memory cells. Furthermore, the increment of the threshold voltage level of the memory cells may be lower when the temperature is low (Cold Temp Case) than when the temperature is high (Hot Temp Case). Accordingly, FIG. 5 illustrates that a distribution of the threshold voltages of memory cells hangs down to the left when the temperature is low (Cold Temp Case). FIG. 5 illustrates providing more program pulses to memory cells by decreasing the value of pass permission bits (for example, the number of pass permission bits) when the temperature is low compared to when the temperature is high.

As described with reference to FIG. 4, in the semiconductor device according to an embodiment of the present disclosure, the number of pass permission bits after the start of a verification operation of a program operation may be increased as the temperature becomes higher. The number of pass permission bits after the start of a verification operation of a program operation may be reduced as the temperature becomes lower.

FIG. 5 illustrates that the temperatures are divided into a case in which the temperatures are high (Hot Temp Case) and a case in which the temperatures are low (Cold Temp Case) and that the number of pass permission bits in the case in which the temperatures are high is greater than the number of pass permission bits in the case in which the temperatures are low.

The case in which the temperatures are high (Hot Temp Case) after the start of a program operation may be described as follows as an example. After the first program pulse Pulse is provided to memory cells (①), the second program pulse Pulse may be provided to the memory cells because the number of memory cells that have been programmed successfully, that is, the number of verification pass bits, is not greater than the number of pass permission bits in the first verification operation. After the second program pulse Pulse is provided to the memory cells (②), the third program pulse Pulse may be provided to the memory cells because the number of memory cells that have been programmed successfully (i.e., the number of verification pass bits) is not greater than the number of pass permission bits after the start of the second verification operation. After the third program pulse Pulse is provided to the memory cells (③), the fourth program pulse Pulse may be provided to the memory cells because the number of memory cells that have been programmed successfully (i.e., the number of verification pass bits) is not greater than the number of pass permission bits after the start of the third verification operation. After the fourth program pulse Pulse is provided to the memory cells (④), the fifth program pulse Pulse may be provided to the memory cells because the number of memory cells that have been programmed successfully (i.e., the number of verification pass bits) is not greater than the number of pass permission bits after the start of the fourth verification operation. After the fifth program pulse Pulse is provided to the memory cells (⑤), the program operation may be terminated because the number of memory cells that have been programmed successfully (i.e., the number of verification pass bits) is greater than the number of pass permission bits after the start of the fifth verification operation.

The case in which the temperatures are low (Col Temp Case) after the start of a program operation may be described as follows as an example. After the first program pulse Pulse is provided to the memory cells (①), the second program pulse Pulse may be provided to the memory cells because the number of memory cells that have been programmed successfully, that is, the number of verification pass bits, is not greater than the number of pass permission bits in the first verification operation. After the second program pulse Pulse is provided to the memory cells (②), the third program pulse Pulse may be provided to the memory cells because the number of memory cells that have been programmed successfully (i.e., the number of verification pass bits) is not greater than the number of pass permission bits after the start of the second verification operation. After the third program pulse Pulse is provided to the memory cells (③), the fourth program pulse Pulse may be provided to the memory cells because the number of memory cells that have been programmed successfully (i.e., the number of verification pass bits) is not greater than the number of pass permission bits after the start of the third verification operation. After the fourth program pulse Pulse is provided to the memory cells (④), the fifth program pulse Pulse may be provided to the memory cells because the number of memory cells that have been programmed successfully (i.e., the number of verification pass bits) is not greater than the number of pass permission bits after the start of the fourth verification operation. After the fifth program pulse Pulse is provided to the memory cells (⑤), the sixth program pulse may be provided to the memory cells because the number of memory cells that have been programmed successfully (i.e., the number of verification pass bits) is not greater than the number of pass permission bits after the start of the fifth verification operation. After the sixth program pulse Pulse is provided to the memory cells (⑥), the program operation may be terminated because the number of memory cells that have been programmed successfully (i.e., the number of verification pass bits) is greater than the number of pass permission bits after the start of the sixth verification operation.

As described above, the semiconductor device according to an embodiment of the present disclosure may decrease the number of program pulses that are provided to memory cells by reducing the number of pass permission bits after the start of a verification operation of a program operation as a temperature is lowered. Accordingly, the semiconductor device according to an embodiment of the present disclosure can prevent the deterioration of a distribution of the threshold voltages of memory cells after the start of a program operation even at a low temperature.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure. Furthermore, the embodiments may be combined to form additional embodiments.

What is claimed is:

1. A semiconductor device comprising:
a plurality of memory strings coupled between a plurality of bit lines, respectively, and a source line, each of the plurality of memory strings including a plurality of memory cells coupled to a plurality of word lines; and
a plurality of page buffers coupled to the plurality of bit lines, respectively, each of the plurality of page buffers configured to output a verification result by sensing data that have been stored in memory cells that are coupled to each selected word line, among the plurality of memory strings, after a start of a verification operation of a program operation,
wherein a number of memory cells that have been programmed successfully and a pass permission bit are compared based on a temperature of the semiconductor device and the verification result after the start of the verification operation of the program operation, and
wherein the pass permission bit corresponds to the temperature,
wherein the pass permission bit has a value that is reduced as the temperature becomes lower.

2. The semiconductor device of claim 1, wherein
the program operation comprises repeatedly providing the selected word line with a program pulse having a level that gradually rises until the number of memory cells that have been programmed successfully is greater than the pass permission bit, and
wherein the verification operation is performed whenever the program pulse is provided to the memory cells.

3. An operating method of a semiconductor device, the operating method comprising:
performing a program operation;
providing a program pulse to a selected word line;
sensing memory cells to which the program pulse has been provided through a plurality of bit lines; and
comparing a number of memory cells that have been programmed successfully, among the memory cells, in the sensing of the memory cells, and a pass permission bit according to a temperature of the semiconductor device,
wherein the pass permission bit has a value that is reduced as the temperature becomes lower.

4. The operating method of claim 3,
wherein providing the program pulse to the selected word line, sensing the memory cells, and comparing are repeatedly performed until the number of memory cells that have been programmed successfully is greater than the pass permission bit according to the temperature.

5. A semiconductor device comprising:

a cell array including a plurality of memory cells arranged between a plurality of word lines and a plurality of bit lines;

at least one page buffer coupled to the plurality of bit lines, respectively, and configured to, during a program operation, sense data of programmed memory cells among the plurality of memory cells to output a verification result including verification pass bits corresponding to the sensed data;

a temperature sensor configured to sense a temperature of the semiconductor device; and a control circuit configured to:

perform the program operation on the plurality of memory cells, determine a pass permission bit number corresponding to the sensed temperature, compare the verification pass bits with the pass permission bit number, and determine whether to further perform the program operation based on the comparison result, wherein the pass permission bit number is determined based on the sensed temperature such that the pass permission bit number increases as the sensed temperature increases.

6. The semiconductor device of claim 5, wherein the control circuit is configured to determine to stop the program operation based on the comparison result indicating that a number of the verification pass bits exceeds the pass permission bit number, and determine to further perform the program operation based on the comparison result indicating that the number of the verification pass bits is less than or equal to the pass permission bit number.

* * * * *